(12) United States Patent
Liu et al.

(10) Patent No.: US 8,224,266 B2
(45) Date of Patent: Jul. 17, 2012

(54) POWER AMPLIFIER PREDISTORTION METHODS AND APPARATUS USING ENVELOPE AND PHASE DETECTOR

(75) Inventors: Dongtai Liu, Fremont, CA (US); Dali Yang, Mountain View, CA (US); James Anderson, Santa Cruz, CA (US)

(73) Assignee: Dali Systems Co., Ltd., Cayman Islands (KY)

( * ) Notice: Subject to any disclaimer, the term of this patent is extended or adjusted under 35 U.S.C. 154(b) by 588 days.

(21) Appl. No.: 12/203,076

(22) Filed: Sep. 2, 2008

(65) Prior Publication Data

US 2009/0096521 A1 Apr. 16, 2009

Related U.S. Application Data

(60) Provisional application No. 60/969,131, filed on Aug. 30, 2007.

(51) Int. Cl.
*H04B 1/04* (2006.01)

(52) U.S. Cl. ............ 455/114.3; 455/91; 455/67.11; 455/67.13; 455/127.1; 455/126; 375/295; 375/296; 375/297; 330/149

(58) Field of Classification Search ............ 455/114.3, 455/91, 67.11, 67.13, 127.1, 126; 330/149; 375/295, 296, 297
See application file for complete search history.

(56) References Cited

U.S. PATENT DOCUMENTS

| | | | |
|---|---|---|---|
| 4,638,248 A * | 1/1987 | Schweickert | ............ 324/76.21 |
| 4,700,151 A | 10/1987 | Nagata | |
| 4,890,300 A | 12/1989 | Andrews | |
| 4,929,906 A | 5/1990 | Voyce et al. | |
| 5,049,832 A | 9/1991 | Cavers | |
| 5,121,412 A | 6/1992 | Borth | |
| 5,132,639 A | 7/1992 | Blauvelt et al. | |
| 5,396,190 A | 3/1995 | Murata | |
| 5,486,789 A | 1/1996 | Palandech et al. | |
| 5,579,342 A | 11/1996 | Crozier | |
| 5,675,287 A | 10/1997 | Baker et al. | |
| 5,678,198 A | 10/1997 | Lemson | |
| 5,732,333 A | 3/1998 | Cox et al. | |
| 5,757,229 A | 5/1998 | Mitzlaff | |
| 5,786,728 A | 7/1998 | Alinikula | |
| 5,936,464 A | 8/1999 | Grondahl | |
| 5,937,011 A | 8/1999 | Carney et al. | |
| 5,949,283 A | 9/1999 | Proctor et al. | |
| 5,959,499 A | 9/1999 | Khan et al. | |
| 5,963,549 A | 10/1999 | Perkins et al. | |
| 6,054,896 A | 4/2000 | Wright et al. | |

(Continued)

*Primary Examiner* — Junpeng Chen
(74) *Attorney, Agent, or Firm* — Kilpatrick Townsend & Stockton LLP

(57) ABSTRACT

An embodiment of the invention is a predistortion approach to linearize a power amplifier without frequency conversion of the RF signals by using envelope and phase detectors to detect the error to be corrected, and then one or more analog multiplier(s) and a DSP-based processor. For the analog embodiment, the inherent nature of the analog circuitries allows digital predistortion processing structured directly at the RF band, and enables a single power amplifier to support multi-modulation schemes, multi-carriers and multi-channels. As a result, the predistortion architecture is particularly suitable for wireless transmission systems, such as base-stations, repeaters, and indoor signal coverage systems. The wireless system performance can be improved and upgraded just by using the new PA module rather than change or rebuild new subsystem in existing base station. The analog embodiment can also mix and match its analog multipliers with other analog components such as phase splitters, phase shifters, attenuators, filters, couplers, mixers, low-noise amplifiers, buffers, envelope detectors, and etc., to provide additional features.

16 Claims, 2 Drawing Sheets

U.S. PATENT DOCUMENTS

| | | |
|---|---|---|
| 6,055,418 A | 4/2000 | Harris et al. |
| 6,091,941 A | 7/2000 | Moriyama et al. |
| 6,240,144 B1 | 5/2001 | Ha |
| 6,242,979 B1 | 6/2001 | Li |
| 6,246,286 B1 * | 6/2001 | Persson ............... 330/149 |
| 6,246,865 B1 | 6/2001 | Lee |
| 6,275,685 B1 * | 8/2001 | Wessel et al. ............ 455/126 |
| 6,301,579 B1 | 10/2001 | Becker |
| 6,396,345 B2 * | 5/2002 | Dolman ............... 330/149 |
| 6,400,774 B1 | 6/2002 | Matsuoka et al. |
| 6,424,225 B1 | 7/2002 | Choi et al. |
| 6,512,417 B2 | 1/2003 | Booth et al. |
| 6,552,634 B1 | 4/2003 | Raab |
| 6,625,429 B1 | 9/2003 | Yamashita |
| 6,639,050 B1 | 10/2003 | Kieliszewski |
| 6,677,870 B2 | 1/2004 | Im et al. |
| 6,697,436 B1 | 2/2004 | Wright et al. |
| 6,703,897 B2 | 3/2004 | O'Falherty et al. |
| 6,741,663 B1 | 5/2004 | Tapio et al. |
| 6,747,649 B1 | 6/2004 | San-z Pastor et al. |
| 6,751,447 B1 | 6/2004 | Jin et al. |
| 6,963,242 B2 | 11/2005 | White et al. |
| 6,983,025 B2 | 1/2006 | Schell |
| 6,985,704 B2 | 1/2006 | Yang et al. |
| 7,035,345 B2 | 4/2006 | Jeckeln et al. |
| 7,042,287 B2 | 5/2006 | Robinson |
| 7,061,314 B2 | 6/2006 | Kwon et al. |
| 7,064,606 B2 | 6/2006 | Louis |
| 7,079,818 B2 | 7/2006 | Khorram |
| 7,102,442 B2 | 9/2006 | Anderson |
| 7,103,329 B1 | 9/2006 | Thon |
| 7,104,310 B2 | 9/2006 | Hunter |
| 7,106,806 B1 | 9/2006 | Kenington |
| 7,109,792 B2 | 9/2006 | Leffel |
| 7,109,998 B2 | 9/2006 | Smith |
| 7,151,913 B2 | 12/2006 | Ahmed |
| 7,158,765 B2 | 1/2007 | Blair et al. |
| 7,193,472 B2 | 3/2007 | Gotou et al. |
| 7,248,642 B1 | 7/2007 | Vella-Coleiro |
| 7,259,630 B2 | 8/2007 | Bachman et al. |
| 7,321,635 B2 | 1/2008 | Ocenasek et al. |
| 7,321,636 B2 | 1/2008 | Harel et al. |
| 7,372,918 B2 | 5/2008 | Muller et al. |
| 7,469,491 B2 | 12/2008 | McCallister et al. |
| 7,831,221 B2 | 11/2010 | Leffel et al. |
| RE42,287 E | 4/2011 | Apodaca et al. |
| 2002/0034260 A1 | 3/2002 | Kim |
| 2002/0044014 A1 | 4/2002 | Wright et al. |
| 2002/0080891 A1 | 6/2002 | Ahn et al. |
| 2002/0101937 A1 | 8/2002 | Antonio et al. |
| 2002/0101938 A1 | 8/2002 | Horaguchi et al. |
| 2002/0186783 A1 | 12/2002 | Opas et al. |
| 2002/0187761 A1 | 12/2002 | Im et al. |
| 2002/0193085 A1 | 12/2002 | Mathe et al. |
| 2003/0095608 A1 | 5/2003 | Duperray |
| 2003/0179829 A1 | 9/2003 | Pinckley et al. |
| 2003/0179830 A1 | 9/2003 | Eidson et al. |
| 2003/0207680 A1 | 11/2003 | Yang et al. |
| 2004/0017859 A1 | 1/2004 | Sills et al. |
| 2004/0240585 A1 | 12/2004 | Bishop et al. |
| 2005/0079834 A1 * | 4/2005 | Maniwa et al. ............ 455/114.3 |
| 2005/0159117 A1 | 7/2005 | Bausov et al. |
| 2005/0262498 A1 | 11/2005 | Ferguson et al. |
| 2006/0012426 A1 | 1/2006 | Nezami |
| 2006/0270366 A1 | 11/2006 | Rozenblit et al. |
| 2007/0075780 A1 | 4/2007 | Krvavac et al. |
| 2007/0171234 A1 | 7/2007 | Crawfis et al. |
| 2007/0241812 A1 | 10/2007 | Yang et al. |

\* cited by examiner

P/M Based DPD Implementation

Alternative P/M Based DPD Implementation

POWER AMPLIFIER PREDISTORTION METHODS AND APPARATUS USING ENVELOPE AND PHASE DETECTOR

CROSS REFERENCE TO RELATED APPLICATIONS

This application claims the benefit of U.S. patent application Ser. No. 10/137,556, filed May 1, 2002, entitled "System and Method for Digital Memorized Predistortion for Wireless Communication," now U.S. Pat. No. 6,985,704; U.S. patent application Ser. No. 11/262,079, filed Oct. 27, 2005, which is a continuation of Ser. No. 10/137,556; and U.S. Provisional Application Ser. No. 60/969,131, filed Aug. 30, 2007, entitled "Power Amplifier Predistortion Methods and Apparatus Using Envelope and Phase Detector", all of which are incorporated herein by reference in full for all purposes.

BACKGROUND OF THE INVENTION

The current and next-generation wireless communication systems will utilize improved power amplifier (PA) efficiency technology for a variety of broadband and multimedia services, supported by the advanced wireless radio frequency (RF) transmitter, in which the linear and high-efficient high power amplifier will improve the transmitted quality, system performance and cost saving. Traditional predistortion technologies and schemes used widely to linearize PA in wireless communication systems are (i) analog feed-forward linearizers implemented in RF band by means of analog hardware circuit, and (ii) digital predistortion schemes in the baseband that involve a feedback channel and driven by digital signal processing (DSP) algorithms and integrated circuits.

Conventional analog predistortion schemes are mainly based on the principle of error subtraction and power-matching with dedicated hardware circuitries to realize non-linear corrections to PA. These approaches must use an auxiliary PA and complicated hardware circuitries to match exactly the transmitted power-balance, time-delay and errors generated by the main PA. After a perfect matching is obtained, the non-linear distortion errors from the main PA can then be canceled by those distortion errors from the auxiliary PA. Due to the complexities of the nonlinear predistortion circuits, which among other things involve many variables and parameters, the analog schemes require significant fine tuning and other calibration efforts. In addition, such traditional analog schemes are also vulnerable to fluctuating environmental conditions, such as temperature and humidity changes, since perfect alignments of the main PA's signal and that of the auxiliary PA are vital. As a result, traditional predistortion schemes are costly to implement and are limited in their predistortion accuracy and stability in commercialized wireless system environment.

Conventional DSP-based digital predistortion schemes utilize digital microprocessors to compute, calculate and correct PA's nonlinearities: they perform fast tracking and adjustments of signals in the PA system. Since the computations are performed in the digital domain, such digital schemes can also accommodate a wider fluctuations of environmental conditions, and reduce the extent of fine-tuning or calibrations during the manufacturing stage. However, traditional digital predistortion schemes necessitate coded in-phase (I) and quadrature (Q) channel signals in the baseband as the required ideal or reference signals. As a result, the feedback signal from PA output must be down-converted to baseband area by the arrangement of down-converting and demodulation circuitries. Therefore, in order to deploy traditional digital predistortion schemes into base-stations, the digital predistortion engines must be embedded into the baseband architecture of base-stations. This embodiment is a practical implementation challenge since it is frequently inconvenient or impossible to modify the baseband architectures of existing base-stations or base-station designs. Furthermore, since traditional digital predistortion approaches require baseband I-Q signal sources to operate, they are inapplicable to certain RF systems that do not possess any baseband I-Q signal sources, such as repeater and indoor signal coverage subsystems.

SUMMARY OF THE INVENTION

The present disclosure teaches an approach to linearize the output of a power amplifier (PA), such as those used in wireless base stations for communications networks, using direct detection of phase and magnitude distortion together with one or more analog amplitude adjusters which can be, in some embodiments, gain adjusters or simply multipliers (the "Analog Embodiment"). The RF modulated input signal is coupled to a first envelope detector and to one input of a phase detector. The RF output signal from the PA is coupled to a second envelope detector and to a second input of a phase detector. The phase detector compares the input and output phase and outputs a phase error signal. The envelope detectors provide the magnitude of the respective signal. The resulting signals, which are detected without the use of frequency converters and thus eliminate local oscillator (LO) phase noise, are converted to digital form by one or more analog to digital converters (ADC) and thereupon provide an input to a digital predistortion processor (DPP). The DPP, which can be a DSP-based processor with a lookup table, collects phase and magnitude distortion data on the fly and maintains a windowed statistical database in, for example, a look-up table, and thus outputs predistortion characteristics in response to the signals from the phase and envelope detectors. The disclosed approach is especially applicable to all wireless RF transmitter systems and improves both the power efficiency and linearity of wireless transmission systems. Applications of the present invention are suitable for use with all wireless base-stations, access points, mobile equipment and wireless terminals, portable wireless devices, and other wireless communication systems such as microwave and satellite communications. Various alternative embodiments are disclosed, including an embodiment in which the RF modulated signal is converted into quadrature signals and each resulting signal is combined with the analog version of the output signals from the DPP, and another embodiment in which the correction signal for phase is fed to a phase shifter, and the correction signal for amplitude is fed to an amplitude adjuster is a sequential predistortion process It will be appreciated by those skilled in the art that the order of the phase shifter and amplitude adjuster can be interchanged in some embodiments.

The invention permits all DSP processes to occur in the baseband even though no frequency converters are required. In addition, a comparatively low speed ADC can be used, with lower power consumption because of a comparatively low sampling rate. The use of analog processing permits the predistortion to be performed at the RF band, rather than being down-converted and then upconverted, which in turn allows a single PA to continue to support, without internal modification, the multiple modulation schemes typically managed by a modern PA. The following Detailed Description can be

THE FIGURES

DETAILED DESCRIPTION OF THE INVENTION

On a general level, the analog approach of the present invention approach comprises one or more analog multipliers to combine RF modulated signal $v_{RF}(t)$ and predistortion control signal $v_p(t)$ (hereinafter as "RF Modulated Signal" and "Predistortion Control Signal" respectively). Although these devices can be implemented as multipliers in many embodiments, in general they are better thought of as amplitude adjusters. In some embodiments, they also can be referred to as gain adjusters.

The Predistortion Control Signal $v_p(t)$ from the DSP control board is adaptively generated, based on the comparison of the RF Modulated Signal—the ideal input signal from the modulator—and the feedback signal $v_o(t)$ from the PA's output (sometimes referred to hereinafter as the "Feedback Signal"). This permits the predistortion architecture of the present invention to quickly track and compensate for the non-linear characteristics of PA in real-time.

The Analog Embodiment can have one or multiple analog multipliers, and can also mix and match with other analog components such as phase splitters, phase shifters, attenuators, filters, couplers, mixers, low-noise amplifiers, buffers, envelope detectors, and etc., to provide additional controls, features and functionalities.

In an embodiment, the Predistortion Control Signal from the DSP controller is a single analog signal without the requirement of I and Q signals. Such Predistortion Control Signal is first generated by an adaptive calculation in the DSP processor as a baseband signal and then converted to the analog version by a digital-to-analog converter (DAC). All non-linear predistortion correction calculations in this architecture are completed by digital signal processing; hence, the Analog Embodiment is an implementation of digital predistortion in the RF band. By using this approach, the predistortion system does not need the original I and Q digital signals, which are typically required by traditional digital predistortion architectures. The predistortion system simply processes the RF signal directly from the modulator of a base-station system—the RF Modulated Signal—and the feedback signal from the PA's output—the Feedback Signal. Then, the digitized signals are processed in the Digital Predistortion Processor (DPP) which typically comprises a DSP-based processor and associated logic, including a lookup table, where the DSP-based processor implements an adaptive algorithm such as that presented in U.S. Pat. No. 6,985,704, to track, calculate and correct the non-linear distortions of the PA.

Figure 1:
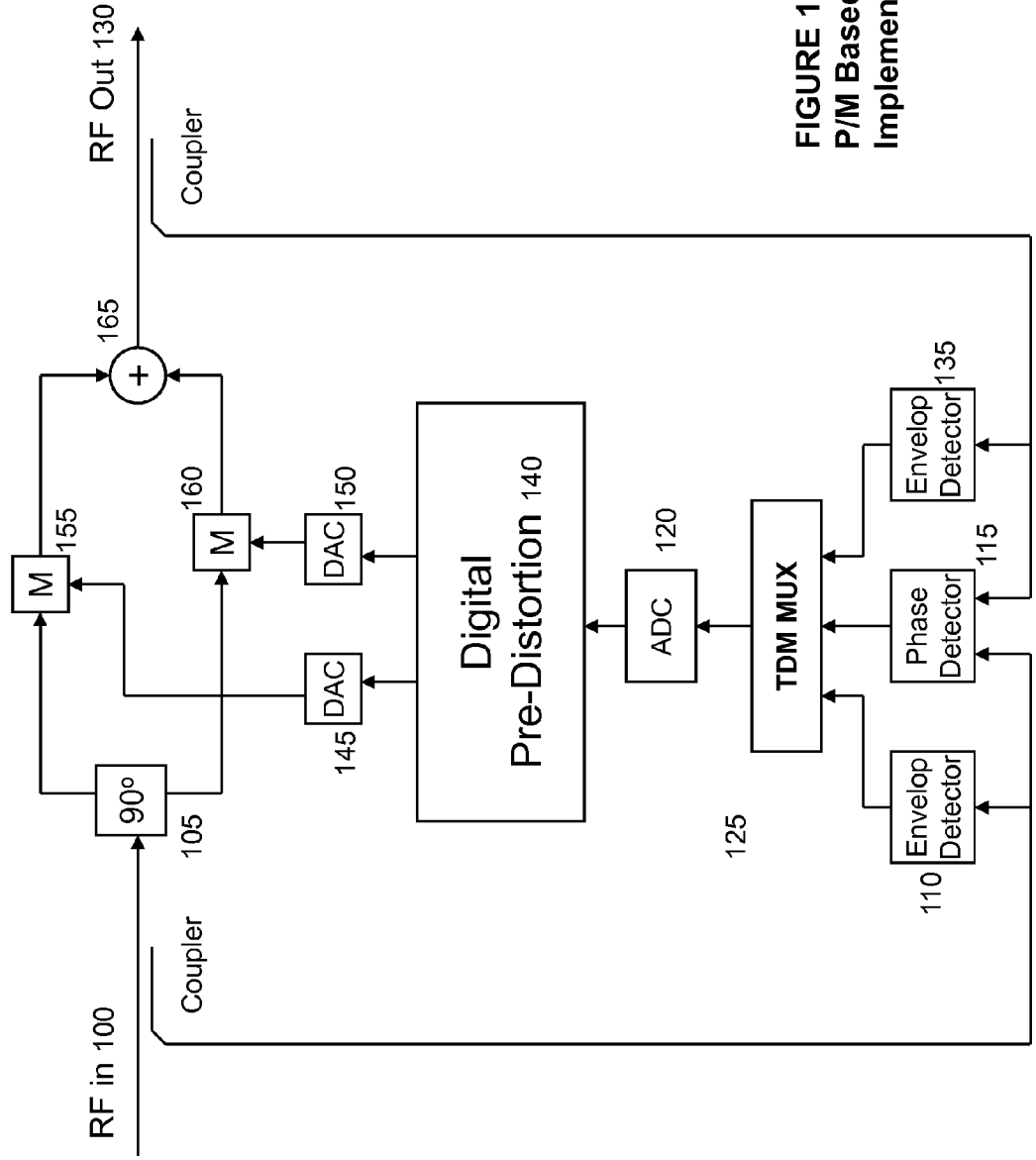
FIG. 1 illustrates in schematic diagram form an embodiment of a phase-magnitude based digital predistortion architecture in accordance with the present invention.
Figure 2:
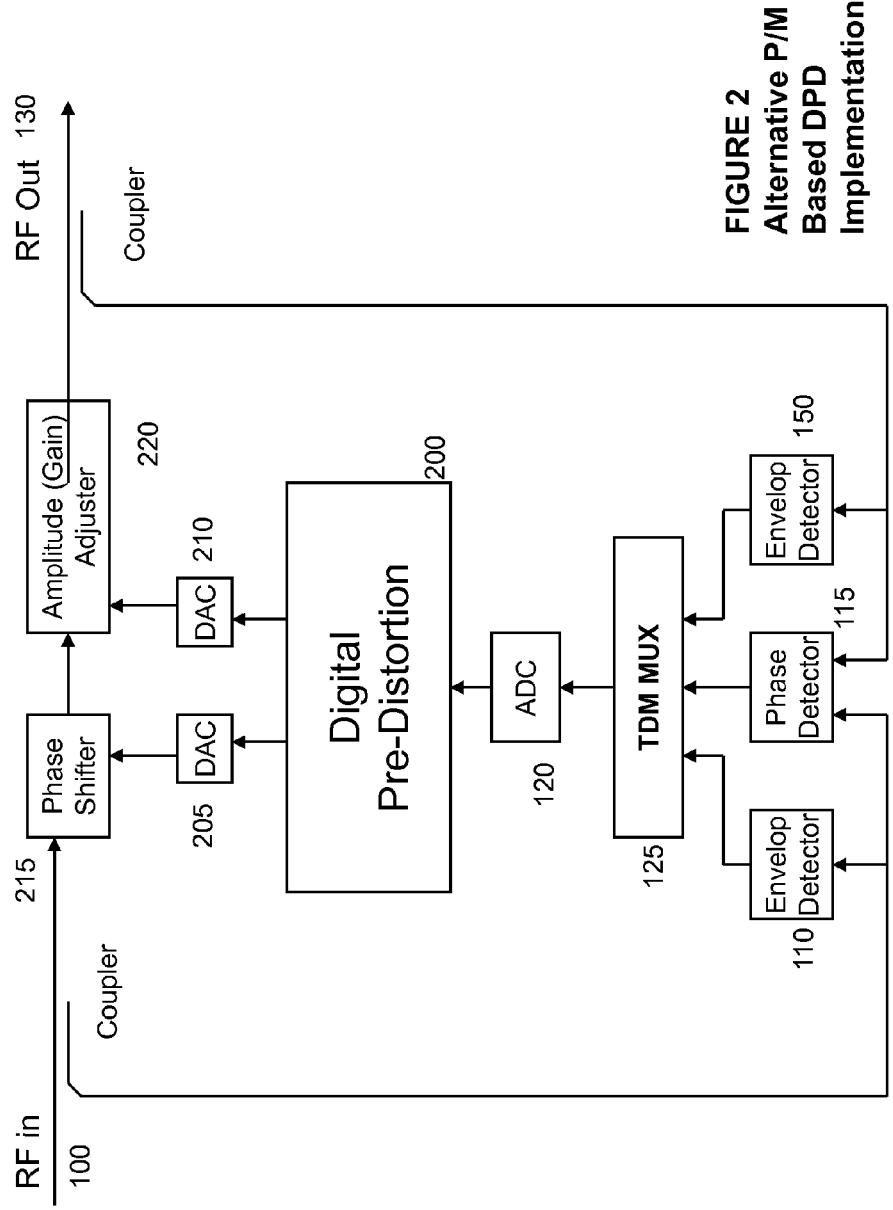
FIG. 2 illustrates an alternative embodiment of a phase-magnitude based digital predistortion architecture in accordance with the present invention.

These general functions can be better appreciated from FIGS. 1 and 2, each of which shows an embodiment of the present invention. Referring first to the embodiment shown in FIG. 1, an RF modulated signal 100 is provided to a quadrature splitter 105. In addition, the RF signal 100 is coupled to an envelope detector 110 and one input of a phase detector 115. The envelope detector 110 determines the magnitude of the incoming signal, and forwards that to an analog-to-digital converter (ADC) 120 through a 3:1 time-division multiplexer (Mux) 125.

Feedback is provided by coupling the RF output signal 130 from the PA 131 to an output envelope detector 135 and to the second input of the phase detector 115. The output of the phase detector 115 and envelope detector 135 are then provided to the ADC 120 through the Mux 125. It will be appreciated that the Mux 125 is not needed in all embodiments, and may be eliminated simply by using three separate ADC's 120.

The output of the ADC 120 is provided to a Digital Predistortion Processor 140 which provides, in digital form, appropriate correction for the signals from the ADC 120 in the manner discussed above and more thoroughly explained in U.S. patent application Ser. No. 11/262,079, entitled System and Method for Digital Memorized Predistortion for Wireless Communication [attached as an exhibit hereto.] The values in the lookup table can be maintained in any of a variety of formats suitable for the quadrature signals that are the outputs of the filter 105, and in at least some embodiments are maintained in polar format to minimize the size of the lookup table that is part of the DPP 140. The quadrature outputs of the DPP 140 are provided to digital-to-analog converters 145 and 150, after which they are combined with the quadrature signals derived from the RF modulated input 100 in multipliers 155 and 160, respectively. The quadrature signals are then reassembled in adder 165, which provides the input to the PA. It will be appreciated that, in some embodiments, the elements 155 and 160 will be multipliers. However, on a more general level, these components can be implemented as any form of amplitude adjuster, including linear or nonlinear gain adjustment, and so are not limited to multiplier implementations.

Referring next to FIG. 2, an alternative arrangement to FIG. 1 can be better appreciated. As with FIG. 1, the embodiment of FIG. 2 operates directly on the RF band, and so can handle multiple modulation schemes. The embodiment of FIG. 2 also does not require frequency conversion of the RF modulated signal, thereby simplifying construction of the device. For convenience, like elements with FIG. 1 are assigned light reference numerals, and have substantially the same functions as in FIG. 1, as elaborated upon more fully in the following. Thus, the output of the ADC 120 provides the inputs to a DPP 200, which in this case outputs the correction factors in a format different than FIG. 1 because the outputs are not quadrature signals, but otherwise functions substantially as discussed hereinabove. In the present case, the outputs of the DPP 200 are arranged to separately provide phase correction and amplitude correction.

The outputs of the DPP 200 are provided to DAC's 205 and 210. The output of the DAC 205 is provided to a phase shifter 215, while the output of the DAC 210 is provided to an amplitude adjuster 220. It will be appreciated from the foregoing discussion that the amplitude adjuster can be implemented, depending upon the particular design, in any suitable format and thus can comprise, as just some examples, a linear or nonlinear gain adjuster or a multiplier. As can be appreciated from FIG. 2, the output of the phase shifter 215 provides the input to the amplitude adjuster 220, and the output of the amplitude adjuster 220 provides the input to the PA 131.

It will be appreciated by those skilled in the art, in light of the foregoing embodiments and teachings, that numerous other alternatives and embodiments that do not depart from the invention will be apparent to those skilled in the art. As a result, the invention is not intended to be limited by the foregoing description, but only by the appended claims.

We claim:

1. A predistortion architecture for use with power amplifiers for wireless communications systems, the predistortion architecture comprising:
   an input for receiving signals representative of RF band signals,
   a first envelope detector responsive to representative signals of RF band input signals at an input of a modulator for providing a first input to a time-division multiplexer;
   a second envelope detector adapted to be responsive to an output signal representative of the output signals of a power amplifier for providing a second input to the time-division multiplexer;
   a phase detector responsive to the signals representative of the RF band input signals and the signals representative of the power amplifier output signals for providing a third input to the time-divisional multiplexer;
   a digital predistortion processor responsive to inputs from the time-division multiplexer for generating predistortion correction signals as an output; and
   logic for converting the output of the digital predistortion processor into analog predistortion correction signals and combining them with the RF input signals.

2. The predistortion architecture of claim 1 wherein the time-divisional multiplexer comprises a 3:1 multiplexer.

3. The predistortion architecture of claim 1 wherein the digital predistortion processor comprises a lookup table.

4. The predistortion architecture of claim 3 wherein the lookup table is characterized by a polar format.

5. The predistortion architecture of claim 1 wherein the logic comprises a plurality of digital to analog converters, a plurality of multipliers, and an adder.

6. The predistortion architecture of claim 1 further comprising an analog to digital converter coupled between the time-division multiplexer and the digital predistortion processor.

7. A system for predistorting power amplifiers, the system comprising:
   a power amplifier;
   a plurality of Radio Frequency (RF) couplers for sampling an RF input and an RF output signal;
   a voltage dependent phase shifter communicatively coupled to a voltage dependent amplitude adjuster, the amplitude adjuster configured to provide an input to the power amplifier;
   a plurality of Radio Frequency (RF) envelope detectors, each communicatively coupled to at least one of the plurality of RF couplers, at least one envelope detector configured to receive signals representative of the RF input signal, and at least one envelope detector configured to receive signals representative of output signals from the power amplifier;
   a Radio Frequency (RF) phase detector communicatively coupled to at least one of the plurality of RF couplers, and configured to receive signals representative of the RF input signal and determine a phase error signal based on the RF input signal;
   a time division multiplexer communicatively coupled to the phase detector and at least one of the plurality of envelope detectors;
   a digital predistortion processor with A/D and D/A converters, at least one of the D/A converters being communicatively coupled to the phase shifter or amplitude adjuster and at least one of the A/D converters being communicatively coupled to the time division multiplexer; and
   a look up table communicatively coupled to the digital predistortion processor, for compensating an amplitude and phase distortion.

8. The system of claim 7 further comprising a time delay incorporated in the phase shifter.

9. The system of claim 7 wherein the time-divisional multiplexer comprises a 3:1 multiplexer.

10. The system of claim 7 wherein the digital predistortion processor comprises a lookup table.

11. The system of claim 10 wherein the lookup table is characterized by a polar format.

12. A system for predistorting power amplifiers, the system comprising:
   a power amplifier;
   a plurality of Radio Frequency (RF) couplers for sampling an RF input and an RF output signal;
   a phase shifter communicatively coupled to at least one of a plurality of voltage dependent amplitude adjusters, at least one of the amplitude adjusters configured to provide an input to the power amplifier;
   a plurality of Radio Frequency (RF) envelope detectors, each communicatively coupled to at least one of the plurality of RF couplers, at least one envelope detector configured to receive signals representative of the RF input signal, and at least one envelope detector configured to receive signals representative of output signals from the power amplifier;
   a Radio Frequency (RF) phase detector communicatively coupled to at least one of the plurality of RF couplers, and configured to receive signals representative of the RF input signal and determine a phase error signal based on the RF input signal;
   a time division multiplexer communicatively coupled to the phase detector and at least one of the plurality of envelope detectors;
   a digital predistortion processor with A/D and D/A converters, at least one of the D/A converters being communicatively coupled to the phase shifter or one of the plurality of amplitude adjusters and at least one of the A/D converters being communicatively coupled to the time division multiplexer; and
   a look up table communicatively coupled to the digital predistortion processor, for compensating an amplitude and phase distortion.

13. The system of claim 12 wherein the phase shifter includes a time delay element.

14. The system of claim 12 wherein the time-divisional multiplexer comprises a 3:1 multiplexer.

15. The system of claim 12 wherein the digital predistortion processor comprises a lookup table.

16. The system of claim 15 wherein the lookup table is characterized by a polar format.

* * * * *